United States Patent [19]
Hattori

[11] Patent Number: 5,126,603
[45] Date of Patent: Jun. 30, 1992

[54] CIRCUIT UTILIZES N-CHANNEL MOS TRANSISTORS HAVING REDUCED AREA DIMENSION FOR EFFECTIVELY DETECTING OUTPUT CURRENT OF A H-BRIDGE CIRCUIT

[75] Inventor: Masayuki Hattori, Tokyo, Japan

[73] Assignee: NEC Corporation, Tokyo, Japan

[21] Appl. No.: 557,183

[22] Filed: Jul. 24, 1990

[30] Foreign Application Priority Data

Jul. 26, 1989 [JP] Japan ................. 1-194989

[51] Int. Cl.$^5$ .............. H03K 17/687; H03K 3/01; H03K 17/74; H03L 5/00
[52] U.S. Cl. ................. 307/571; 307/573; 307/270; 307/257; 307/296.8; 307/264
[58] Field of Search .......... 307/571, 573, 583, 584, 307/257, 270, 241, 264, 296.8, 300; 323/312, 313

[56] References Cited

U.S. PATENT DOCUMENTS

| | | | |
|---|---|---|---|
| 4,859,877 | 8/1989 | Cooperman et al. | 307/270 |
| 4,931,676 | 6/1990 | Baiocchi et al. | 307/571 |
| 4,950,919 | 8/1990 | Rossi et al. | 307/571 |
| 5,057,720 | 10/1991 | Hattori | 307/571 |

Primary Examiner—Stanley D. Miller
Assistant Examiner—Trong Phan
Attorney, Agent, or Firm—Laff, Whitesel Conte & Saret

[57] ABSTRACT

The inventive power supply detecting circuit includes an additional fifth, sixth, seventh and eighth MOS transistors within an output buffer H bridge circuit of a conventional type, in order to reduce the power consumption in the electric current detection circuit thereof. The fifth MOS transistor has a drain connected to a power supply terminal. Its source is connected to an electric current detecting terminal. Its gate is connected to a first internal input terminal. The sixth MOS transistor has a drain connected to the electric current detecting terminal. Its source is connected to a first output terminal. Its gate is connected to the first internal input terminal. The seventh MOS transistor has a drain connected to the power supply terminal. Its source is connected to the electric current detecting terminal. Its gate is connected to a second internal input terminal. The eighth MOS transistor has a drain connected to the electric current detecting terminal. Its source is connected to a second output terminal. Its gate is connected to the second internal input terminal. The size of the fifth through eighth MOS transistors is smaller than the size of the other MOS transistors which together constitute the output buffer H bridge circuit. This arrangement significantly reduces the amount of electric power that is consumed in the electric current detecting circuit.

4 Claims, 4 Drawing Sheets

CIRCUIT UTILIZES N-CHANNEL MOS TRANSISTORS HAVING REDUCED AREA DIMENSION FOR EFFECTIVELY DETECTING OUTPUT CURRENT OF A H-BRIDGE CIRCUIT

BACKGROUND OF THE INVENTION

The present invention relates to an electric current detecting circuit, and more specifically relates to a particular electric current detecting circuit of the type having an output stage in the form of a H bridge circuit composed of four field effect transistors and being contained in a semiconductor integrated circuit of motor driver which is used in a floppy disk apparatus and a hard disk apparatus.

As shown in FIG. 1, such type of the conventional electric current limiting circuit is comprised of a H bridge circuit composed of four MOS transistors 5-8 and a resistor 25. Namely, as shown in FIG. 1, there is provided a control circuit 11 for feeding an output to first and second internal input terminals 12 and 13 in response to a signal from an input terminal 1 and further for controlling concurrently output voltage levels of the first and second internal input terminals 12 and 13 according to a signal level of an electric current detecting input terminal 14. The first MOS transistor 5 has a drain connected to the electric current detecting terminal 14, a source connected to a first output terminal 9 and a gate connected to the internal input terminal 12. The second MOS transistor 6 has a drain connected to the output terminal 9, a source connected to a ground terminal 4 and a gate connected to the internal input terminal 13. The third MOS transistor 7 has a drain connected to the electric current detecting terminal 14, a source connected to a second output terminal 10 and a gate connected to the internal input terminal 13. The fourth MOS transistor 8 has a drain connected to the output terminal 10, a source connected to the ground terminal 4 and a gate connected to the internal input terminal 12. The electric current detecting terminal 14 is connected to a power supply terminal 3 through the electric current detecting resistor 25. The FIG. 1 circuit operates to detect an electric current, flowing through the output buffer H bridge circuit, in the form of a voltage falling across the electric current detecting resistor 25 so as to control the voltages at the internal input terminals 12 and 13 according to the detected level to thereby regulate the electric current flowing through the output buffer H bridge circuit.

Since the above described conventional circuit operates to detect the electric current flowing through the output buffer H bridge circuit by effecting voltage-conversion through the electric current detecting resistor, this resistor consumes a great amount of electric power to thereby hinder the reduction of power consumption to a certain degree. Further, since a power resistor is externally needed, it is impossible to scale down a size of a printed circuit board etc.

SUMMARY OF THE INVENTION

An object of the present invention is to, therefore, reduce power consumption in the electric current detection circuit of the type above described. The inventive power supply detecting circuit includes additional fifth, sixth, seventh and eighth MOS transistors within an output buffer H bridtge circuit of the regular type. The fifth MOS transistor has a drain connected to a power supply terminal, a source connected to an electric current detecting terminal and a gate connected to a first internal input terminal. The sixth MOS transistor has a drain connected to the electric current detecting terminal, a source connected to an first output terminal and a gate connected to the first internal input terminal.

In the present invention, the first through eighth MOS transistors comprise MOS transistors of the double diffusion type.

Further, in the present invention, the fifth through eighth MOS transistors have the same structure but a reduced area dimension as compared to the first through fourth MOS transistors.

The seventh MOS transistor has a drain connected to the power supply terminal, a source connected to the electric current detecting terminal and a gate connected to a second internal input terminal. The eighth MOS transistor has a drain connected to the electric current detecting terminal, a source connected to a second output terminal and a gate connected to the second internal input terminal. The fifth through eighth MOS transistors have a size smaller, by the ratio 1/100-1/500, than that of other MOS transistors which constitute the output buffer H bridge circuit so as to significantly reduce electric power consumed in the electric current detection circuit.

DETAILED DESCRIPTION OF EMBODIMENTS

Figure 1:
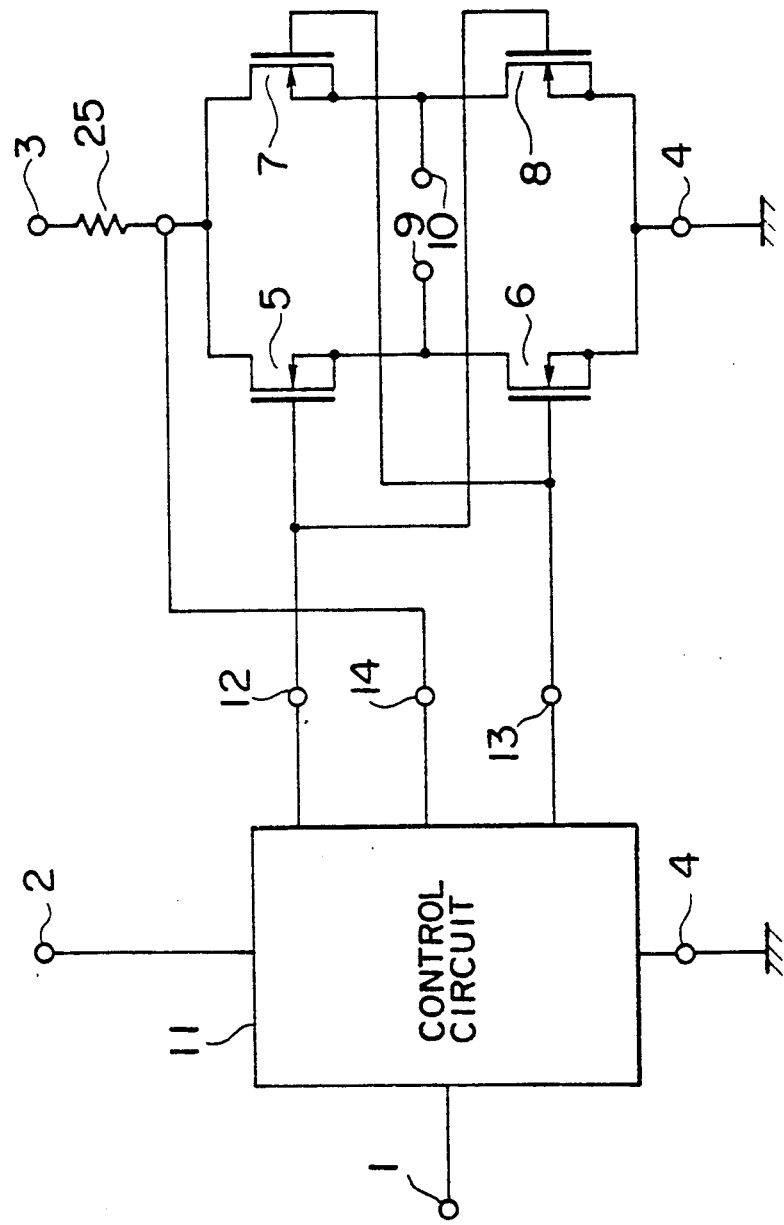
FIG. 1 is a circuit diagram of the conventional electric current detecting circuit.
Figure 2:
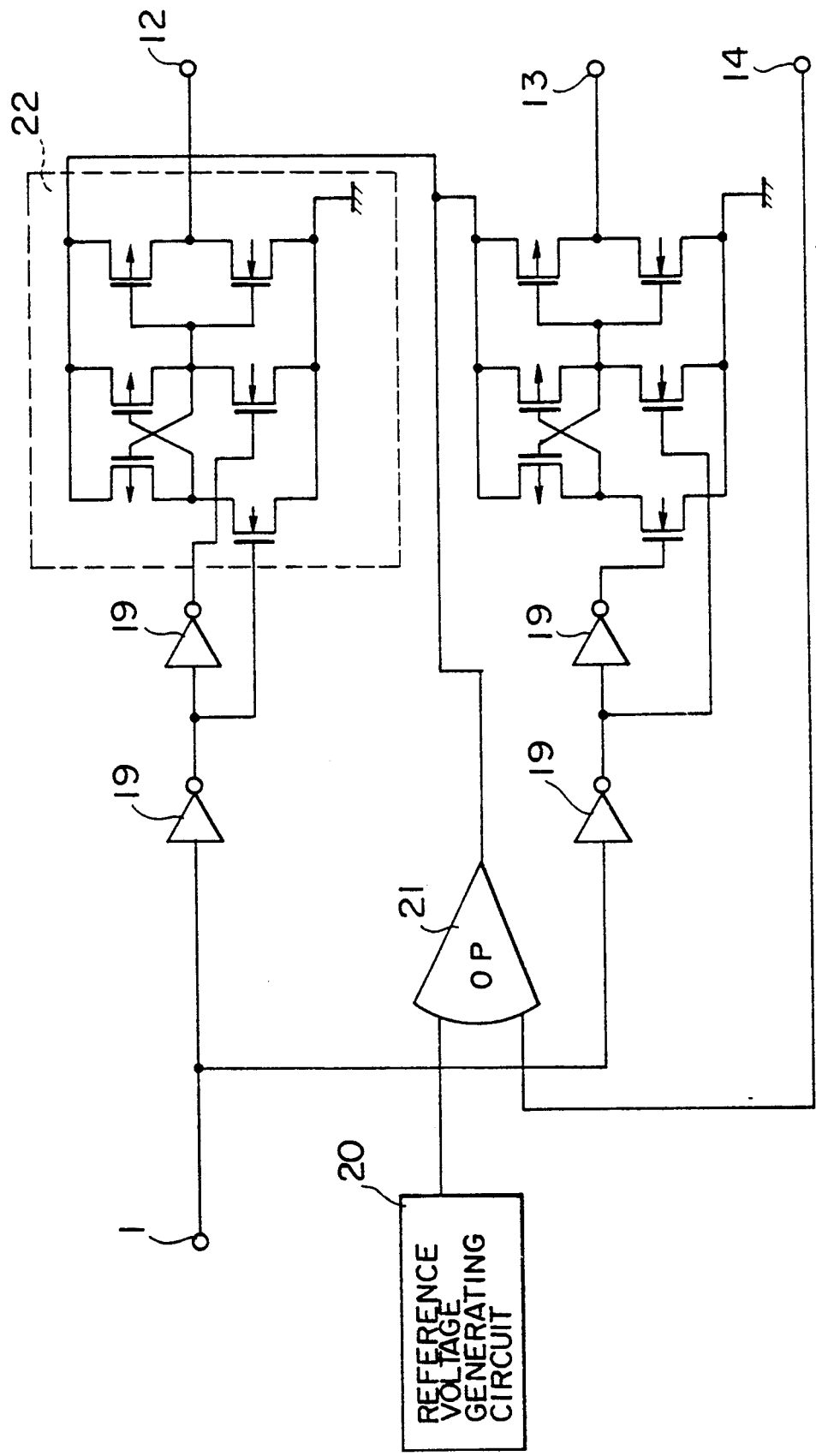
FIG. 2 is a detailed circuit diagram showing an example of a control circuit.
Figure 3:
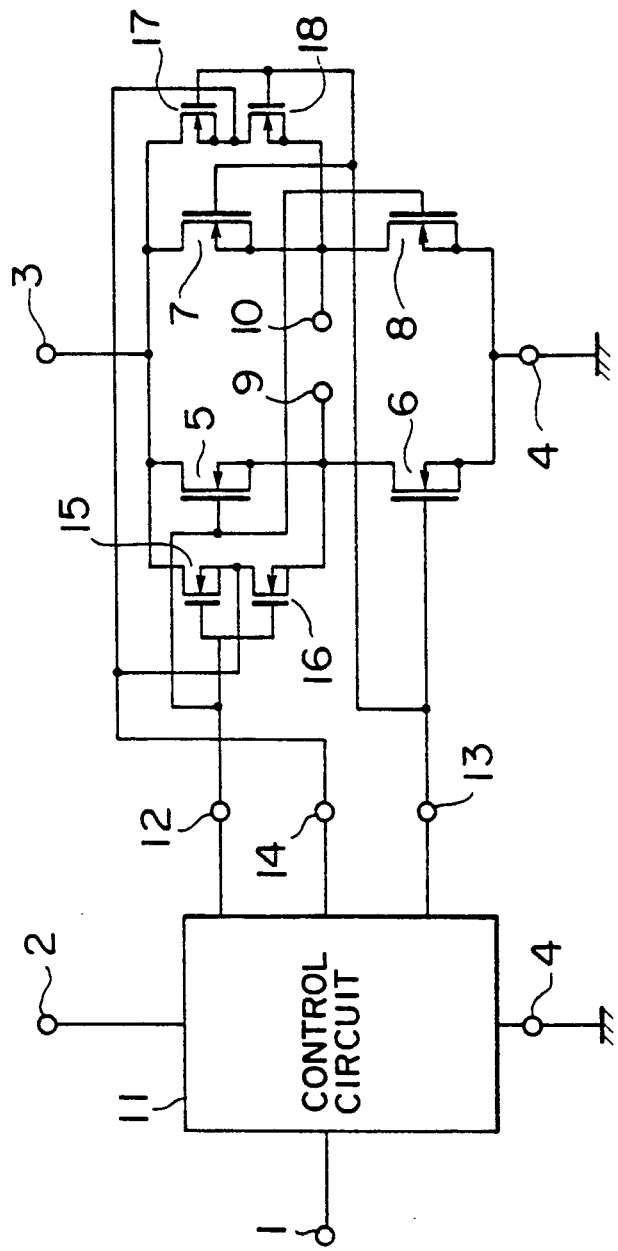
FIG. 3 is a circuit diagram showing a first embodiment according to the present invention.

Next, the present invention is described in detail with reference to the drawings. FIG. 3 shows a first embodiment of the present invention. As shown in FIG. 3, the first embodiment is different from the FIG. 1 conventional circuit in that N channel type MOS transistors 15, 16, 17 and 18 are added. Namely, the N channel type MOS transistor 15 is connected at its drain to a power supply terminal 3, connected at its source to an electric current detecting terminal 14 and connected at its gate to an internal input terminal 12. The N channel type MOS transistor 16 is connected at its drain to the electric current detecting terminal 14, connected at its source to an output terminal 9 and connected at its gate to the internal input terminal 12. The N channel type MOS transistor 17 is connected at its drain to the power supply terminal 3, connected at its source to the electric current detecting terminal 14 and connected at its gate to another internal input terminal 13. Further, the N channel type MOS transistor 18 is connected at its drain to the electric current detecting terminal 14, connected at its source to another output terminal 10 and connected at its gate to the internal input terminal 13. A control circuit 11 of FIG. 3 is comprised of a circuit for controlling an output circuit electric current according to a signal from the electric current detecting terminal 14, a logic circuit for turning on and off the output circuit, and a level shift circuit for driving the output circuit. The detailed circuit construction thereof is shown in FIG. 2 where numeral 19 denotes an inverter circuit, numeral 20 denotes a reference voltage generating circuit, numeral 21 denotes an operational amplifier, and numeral 22 denotes a level shift circuit. The reference voltage generating circuit of FIG. 2 is comprised of a general and regular type utilizing a band gap reference. Concrete operation of the control circuit of FIG. 2 is as follows: when a signal is inputted to the input terminal 1, the corresponding signal is outputted from the internal input terminals 12 and 13, wherein when the signal is at "High" state, the signal becomes power supply voltage of the level shift circuit 22, namely output voltage of the operational amplifier 21, while when the signal is at "Low" state, the signal becomes ground potential. The operational amplifier 21 is connected through the electric current detecting terminal 14 to the electric current detecting circuit. In the operational amplifier 21, a voltage proportional to electric current flowing through H bridge output circuit is compared with the output voltage from the reference voltage generating circuit 20, and the output voltage, namely the power supply voltage of the level shift circuit 22 is controlled so that the voltage proportional to electric current flowing through the H bridge output electric circuit and the output voltage from the reference voltage generating circuit 20 become equal to each other. Thereby voltage applied to a gate of a MOS transistor of the H bridge output circuit is changed. By this operation, a closed loop is formed, and current proportional to output voltage of the reference voltage generating circuit 20 flows through the H bridge output circuit, thereby output current being controlled.

By constructing as described above, electric current detection can be carried out with low loss in the output buffer H bridge circuit. Namely, area ratio is set 1:1/500 between the N channel type MOS transistor 4 which constitutes the output circuit and the N channel MOS transistors 15 and 16 which compose the electric current detecting circuit such that when 500 mA of electric current flows through the output circuit about 0.5 mA of electric current flows through the detecting circuit since the two transistors 15, 16 are connected in series to each other. The reason of low loss is that, since the transistor 5 and the other transistors 15, 16 have the quite identical structure, their respective ON resistances are simply inversely proportional to their respective area dimension. Such relation is similarly applied between the transistor 7 and the other transistors 17, 18.

The power consumption is calculated in this case as follows. Namely, when flowing 500 mA of electric current through the output circuit, a voltage fall may be, for example, 0.5 V (ON-resistance 1.0Ω) between the power supply terminal 3 and the output terminal 9. Thus, the power consumption is calculated to $P = 0.5 \text{ V} \times 5.0 \times 10^{-4} \text{ A} = 2.5 \times 10^{-4} \text{ W}$ in the inventive circuit. On the other hand, when the conventional circuit performs a similar voltage detection, the power loss is calculated to $P = 0.5 \text{ V} \times 0.5 \text{ A} = 2.5 \times 10^{-1} \text{ W}$. Therefore, the inventive circuit can reduce a loss, i.e., power consumed in the detecting circuit by the rate 1/1000 as compared to the conventional circuit.

Figure 4:
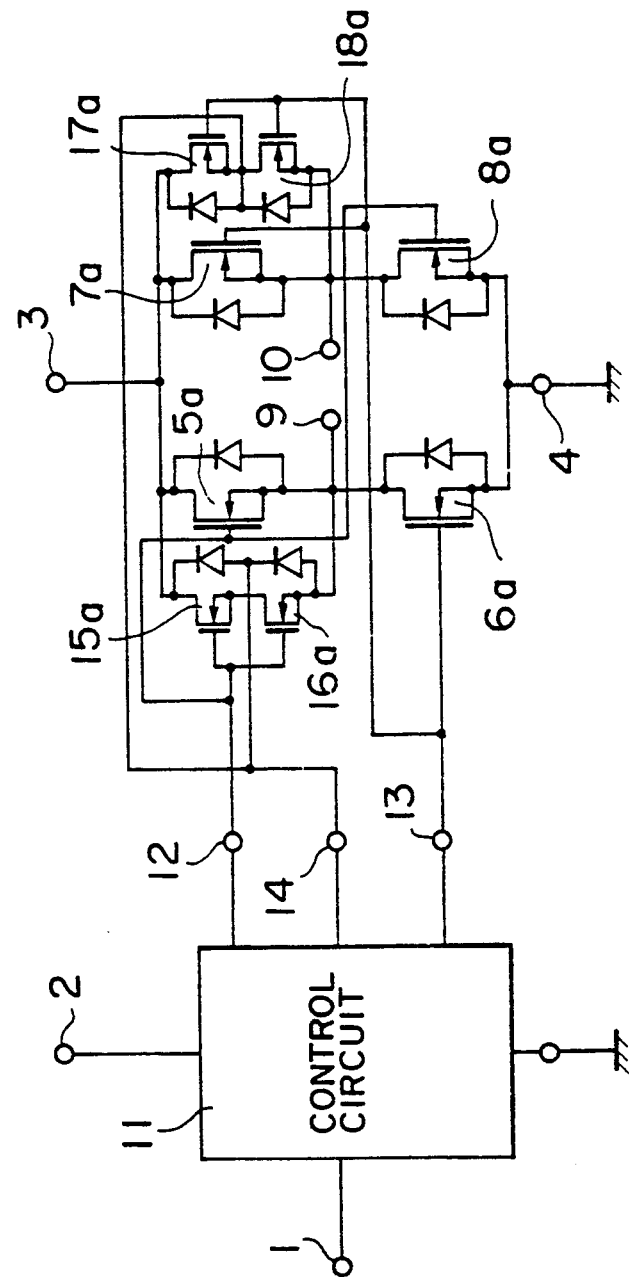
FIG. 4 is a circuit diagram showing a second embodiment according to the present invention.

FIG. 4 is a circuit diagram showing a second embodiment of the present invention. In this embodiment, MOS transistors 5a-8a of the double diffusion type are utilized in place of the MOS transistors 5-8 in the first embodiment. In similar manner, MOS transistors 15a-18a of the double diffusion type are utilized in place of the MOS transistors 15-18. The MOS transistor of the double diffusion type can achieve the same effect as in the regular MOS transistor. The above described embodiments are solely directed to MOS transistors of the N channel type. However, the same effect can be obtained in the structure where MOS transistors of the P channel type are utilized as transistors 5 and 7 at high side of the output H bridge circuit and are utilized as transistors 15-18 which compose the electric current detecting circuit.

As described above, according to the present invention, there is provided a pair of series-connected transistors having the same structure but reduced area dimension as compared to the transistors which compose the output H bridge circuit such that the control is effected according to the voltage falling across the pair of transistors to thereby advantageously achieve power consumption reduction, as opposed to the conventional circuit where the output buffer H bridge circuit feeds its electric current to an electric current detecting resistor such that the control is effected according to the value of voltage falling across the resistor. Namely, the transistors used in the electric current detecting circuit has an area dimension smaller, by the ratio 1/100-1/500, than that of the transistors which compose the output circuit so as to effect reduction of the power consumption because the consumed power is proportional to the area dimension. Further, all of the transistors have the same structure and therefore have the same electric characteristics such as threshold voltage effective to accurately monitor the output electric current.

What is claimed is:

1. An electric current detecting circuit comprising: a first MOS transistor having a drain connected to a power supply terminal, a source connected to a first output terminal and a gate connected to a first internal input terminal; a second MOS transistor having a drain connected to said first output terminal, a source connected to a ground terminal and a gate connected to a second internal input terminal; a third MOS transistor having a drain connected to said power supply terminal, a source connected to a second output terminal and a gate connected to said second internal input terminal; a fourth MOS transistor having a drain connected to said second output terminal, a source connected to said ground terminal and a gate connected to said first internal input terminal; a fifth MOS transistor having a drain connected to said power supply terminal, a source connected to an electric current detecting terminal and a gate connected to said first internal input terminal; a sixth MOS transistor having a drain connected to said electric current detecting terminal, a source connected to said first output terminal and a gate connected to said first internal input terminal; a seventh MOS transistor having a drain connected to said power supply terminal, a source connected to said electric current detecting terminal and a gate connected to said second internal input terminal; and an eighth MOS transistor having a drain connected to said electric current detecting terminal, a source connected to said second output terminal and a gate connected to said second internal input terminal.

2. An electric current detecting circuit as claimed in claim 1; wherin the first through eighth MOS transistors comprise MOS transistors of the double diffusion type.

3. An electric current detecting circuit as claimed in claim 1; wherein the fifth through eighth MOS transistors have the same structure but a reduced area dimension as compared to the first through fourth MOS transistors.

4. An electric current detecting circuit as claimed in claim 1 wherein the fifth through eighth MOS transistors have a size which is smaller, by a ratio of approximately 1/100 to 1/500, than the size of the first through fourth MOS transistors.

* * * * *